US008643279B2

(12) United States Patent  (10) Patent No.: US 8,643,279 B2
Kirchmeier et al.  (45) Date of Patent: Feb. 4, 2014

(54) DETERMINING HIGH FREQUENCY OPERATING PARAMETERS IN A PLASMA SYSTEM

(75) Inventors: Thomas Kirchmeier, Teningen (DE); Gerd Hintz, Pfaffenweiler (DE)

(73) Assignee: HUETTINGER Elektronik GmbH + Co. KG, Freiburg (DE)

( * ) Notice: Subject to any disclaimer, the term of this patent is extended or adjusted under 35 U.S.C. 154(b) by 1050 days.

(21) Appl. No.: 12/692,246

(22) Filed: Jan. 22, 2010

(65) Prior Publication Data
US 2010/0170640 A1 Jul. 8, 2010

Related U.S. Application Data

(63) Continuation of application No. PCT/EP2008/005241, filed on Jun. 27, 2008.

(60) Provisional application No. 60/951,392, filed on Jul. 23, 2007.

(51) Int. Cl.
 *H05B 37/00* (2006.01)
(52) U.S. Cl.
 USPC ................................. 315/111.21; 315/326
(58) Field of Classification Search
 USPC .................................................. 315/111.21
 See application file for complete search history.

(56) References Cited

U.S. PATENT DOCUMENTS

| 3,820,008 A | 6/1974 | Guarnaschelli |
| 4,053,848 A | 10/1977 | Kleische |
| 4,215,392 A | 7/1980 | Rhoads |
| 4,490,684 A | 12/1984 | Epsom et al. |
| 4,656,434 A | 4/1987 | Selin |
| 4,701,716 A | 10/1987 | Poole |
| 4,758,941 A | 7/1988 | Felton et al. |
| 4,860,189 A | 8/1989 | Hitchcock |
| 4,910,452 A | 3/1990 | Dickens et al. |

(Continued)

FOREIGN PATENT DOCUMENTS

| EP | 0073059 | 3/1983 |
| EP | 1272014 | 1/2003 |

(Continued)

OTHER PUBLICATIONS

DeVries et al., "Solid State Class DE RF Power Source", Proc. IEEE International Symposium on Industrial Electronics (ISIE'98), vol. 2, pp. 524-529, Pretoria, South Africa, Jul. 1988.

(Continued)

*Primary Examiner* — Kishor Mayekar
(74) *Attorney, Agent, or Firm* — Fish & Richardson P.C.

(57) ABSTRACT

Determining a high frequency operating parameter in a plasma system including a plasma power supply device coupled to a plasma load using a hybrid coupler having four ports is accomplished by: generating two high frequency source signals of identical frequency, the signals phase shifted by 90° with respect to one another; generating a high frequency output signal by combining the high frequency source signals in the hybrid coupler; transmitting the high frequency output signal to the plasma load; detecting two or more signals, each signal corresponding to a respective port of the hybrid coupler and related to an amplitude of a high frequency signal present at the respective port; and based on an evaluation of the two or more signals, determining the high frequency operating parameter.

10 Claims, 5 Drawing Sheets

(56) References Cited

U.S. PATENT DOCUMENTS

| | | |
|---|---|---|
| 4,921,357 A | 5/1990 | Karube et al. |
| 4,980,810 A | 12/1990 | McClanahan et al. |
| 5,195,045 A | 3/1993 | Keane et al. |
| 5,222,246 A | 6/1993 | Wolkstein |
| 5,225,687 A | 7/1993 | Jason |
| 5,363,020 A | 11/1994 | Chen et al. |
| 5,382,344 A | 1/1995 | Hosokawa et al. |
| 5,394,061 A | 2/1995 | Fujii |
| 5,424,691 A | 6/1995 | Sadinsky |
| 5,434,527 A | 7/1995 | Antone |
| 5,435,881 A | 7/1995 | Ogle |
| 5,438,498 A | 8/1995 | Ingemi |
| 5,523,955 A | 6/1996 | Heckman |
| 5,563,775 A | 10/1996 | Kammiller |
| 5,574,410 A | 11/1996 | Collins et al. |
| 5,610,452 A | 3/1997 | Shimer et al. |
| 5,635,762 A | 6/1997 | Gamand |
| 5,810,963 A | 9/1998 | Tomioka |
| 5,875,103 A | 2/1999 | Bhagwat et al. |
| 5,944,942 A | 8/1999 | Ogle |
| 6,038,142 A | 3/2000 | Fraidlin et al. |
| 6,084,787 A | 7/2000 | Nyberg et al. |
| 6,130,831 A | 10/2000 | Matsunaga |
| 6,229,718 B1 | 5/2001 | Nilssen |
| 6,246,599 B1 | 6/2001 | Jang et al. |
| 6,297,696 B1 | 10/2001 | Abdollahian et al. |
| 6,313,584 B1 | 11/2001 | Johnson et al. |
| 6,344,768 B1 | 2/2002 | Daun-Lindberg et al. |
| 6,365,868 B1 | 4/2002 | Borowy et al. |
| 6,703,080 B2 | 3/2004 | Reyzelman et al. |
| 6,704,203 B2 | 3/2004 | Chapuis et al. |
| 6,760,234 B2 | 7/2004 | Yuzurihara et al. |
| 6,777,881 B2 | 8/2004 | Yuzurihara et al. |
| 6,791,851 B2 | 9/2004 | Brkovic |
| 6,909,617 B1 | 6/2005 | Mirskiy |
| 6,992,902 B2 | 1/2006 | Jang et al. |
| 6,996,892 B1 | 2/2006 | Dening et al. |
| 7,138,861 B2 | 11/2006 | Sundström et al. |
| 7,161,818 B2 | 1/2007 | Kirchmeier et al. |
| 7,244,343 B2 | 7/2007 | Watanabe et al. |
| 7,259,623 B2 | 8/2007 | Coleman |
| 7,312,584 B2 | 12/2007 | Tamita et al. |
| 7,333,348 B2 | 2/2008 | Horiuchi et al. |
| 7,353,771 B2 | 4/2008 | Millner et al. |
| 7,403,400 B2 | 7/2008 | Stanley |
| 7,452,443 B2 | 11/2008 | Glueck et al. |
| 7,616,462 B2 | 11/2009 | Millner et al. |
| 7,755,300 B2 | 7/2010 | Kishinevsky et al. |
| 7,796,005 B2 | 9/2010 | Blankenship et al. |
| 7,872,523 B2 | 1/2011 | Sivakumar et al. |
| 7,884,590 B2 | 2/2011 | Liu |
| 8,421,377 B2 * | 4/2013 | Kirchmeier et al. .......... 315/326 |
| 2003/0215373 A1 | 11/2003 | Reyzelman et al. |
| 2004/0031566 A1 | 2/2004 | Takahashi et al. |
| 2004/0105288 A1 | 6/2004 | Watanabe et al. |
| 2004/0114399 A1 | 6/2004 | Lincoln et al. |
| 2005/0088231 A1 | 4/2005 | Ziegler |
| 2005/0088855 A1 | 4/2005 | Kirchmeier et al. |
| 2005/0122087 A1 | 6/2005 | Sakai et al. |
| 2005/0255809 A1 | 11/2005 | Glueck |
| 2006/0158911 A1 | 7/2006 | Lincoln et al. |
| 2006/0191880 A1 | 8/2006 | Kwon et al. |
| 2006/0196426 A1 | 9/2006 | Gluck et al. |
| 2006/0252283 A1 | 11/2006 | Takeda et al. |
| 2007/0121267 A1 | 5/2007 | Kotani et al. |
| 2007/0145900 A1 | 6/2007 | Kirchmeier et al. |
| 2009/0153127 A1 | 6/2009 | Chen |
| 2009/0202741 A1 | 8/2009 | Stimson et al. |

FOREIGN PATENT DOCUMENTS

| | | |
|---|---|---|
| EP | 1783904 | 10/2005 |
| JP | 55082967 | 6/1980 |
| JP | 9120910 A | 5/1997 |
| JP | 10214698 A | 8/1998 |
| JP | 10215160 A | 8/1998 |
| JP | 2001128458 A | 5/2001 |
| JP | 2001185443 A | 7/2001 |
| JP | 2002237419 A | 8/2002 |
| JP | 2005086622 A | 3/2005 |
| JP | 2006165438 A | 6/2006 |
| JP | 2007151331 A | 6/2007 |
| WO | 9749267 | 12/1997 |
| WO | 9857406 | 12/1998 |
| WO | 2005094138 | 6/2005 |

OTHER PUBLICATIONS

Walker et al., " An Isolated MOSFET Gate Driver". Australasian Universities Power Engineering Conference, AUPEC'96, 1996, vol. 1, Melbourne, pp. 175-180.

International Search Report from corresponding PCT Application No. PCT/EP2008/005241, mailed Oct. 22, 2008, 12 pages.

Notice of Transmittal of Copies of Translation of the International Preliminary Report on Patentability for corresponding PCT Application No. PCT/EP2008/005241, mailed Feb. 18, 2010, 7 pages.

* cited by examiner

DETERMINING HIGH FREQUENCY OPERATING PARAMETERS IN A PLASMA SYSTEM

CROSS REFERENCE TO RELATED APPLICATIONS

This application is a continuation of PCT International Application No. PCT/EP2008/005241, filed Jun. 27, 2008, incorporated herein by reference, which claims priority under 35 U.S.C. §119(e) to U.S. Patent No. 60/951,392, filed on Jul. 23, 2007, hereby incorporated by reference in its entirety.

TECHNICAL FIELD

This disclosure relates to determining high frequency operating parameters, which arise between a plasma load and a plasma power supply device.

BACKGROUND

A plasma is a special aggregate state, which is produced from a gas. Each gas essentially comprises atoms and/or molecules. In the case of a plasma, this gas is for the most part ionized. This means that, by supplying energy, the atoms or molecules are split into positive and negative charge carriers (i.e., ions and electrons). A plasma is suitable for the processing of workpieces since the electrically charged particles are chemically extremely reactive and can also be influenced by electrical fields. The charged particles can be accelerated by means of an electrical field onto a workpiece, where, on impact, they are able to extract individual atoms from the workpiece. The separated atoms can be removed via a gas flow (etching), or deposited as a coating on other workpieces (thin-film production). Such processing by means of a plasma is used above all when extremely thin layers, in particular in the region of a few atom layers, are to be processed. Typical applications are semiconductor technology (coating, etching etc.), flat screens (similar to semiconductor technology), solar cells (similar to semiconductor technology), architectural glass coating (thermal protection, glare protection, etc.), memory media (CDs, DVDs, hard drives), decorative layers (colored glasses etc.) and tool hardening. These applications make great demands on accuracy and process stability. Furthermore, a plasma can also be used to excite lasers, in particular gas lasers.

To generate a plasma from a gas, energy has to be supplied to the gas. This can be effected in different ways, for example, via light, heat, or electrical energy. A plasma for the processing of workpieces is typically ignited and maintained in a plasma chamber.

To that end, normally a noble gas, e.g. argon, is introduced into the plasma chamber at low pressure. Via electrodes and/or antennas, the gas is exposed to an electrical field. A plasma is generated and is ignited when several conditions are satisfied. First of all, a small number of free charge carriers must be present, in which case, free electrons, which are typically present to a very small extent, are used. The free charge carriers are so forcefully accelerated by the electrical field that as they collide with atoms or molecules of the noble gas they release additional electrons, thereby producing positively charged ions and further negatively charged electrons. The additional free charge carriers are in turn accelerated and, as they collide, generate more ions and electrons. An avalanche effect commences. The discharges produced as these particles collide with the wall of the plasma chamber or other objects and the natural recombination counteract the continuous generation of ions and electrons (i.e., electrons are attracted by ions and recombine to form electrically neutral atoms or molecules). For that reason, an ignited plasma must be constantly supplied with energy in order for it to be maintained.

The supply of energy can be effected via a direct current supply device or an alternating current supply device. The following remarks relate to high frequency (HF) alternating current supply devices with an output frequency >3 MHz.

Plasmas have a very dynamic impedance which makes it difficult to supply uniform HF power. For instance, during the ignition process, the impedance changes very quickly from a high value to a low value. As a result, negative effective resistances can occur during operation, which reduce the current flow as the voltage rises, and undesirable local discharges (arcs) may occur, which may damage the material to be processed, the plasma chamber, or the electrodes.

Power supply devices for plasmas (plasma supply devices) must therefore be designed for a high output power and a high reflected power. EP 1 701 376 A1 has shown that such plasma supply devices can advantageously be achieved by relatively small high frequency amplifiers, the output powers of which are coupled by a coupler, preferably by a 3-dB coupler (e.g., hybrid coupler, Lange coupler, etc.). For that purpose, the two high frequency amplifiers are connected to two ports of the hybrid coupler, hereafter called port 1 and port 2. The high frequency amplifiers are driven in such a way that their high frequency signals of the same fundamental frequency have a phase shift of 90° with respect to one another. At a third port of the hybrid coupler, the first of the two high frequency signals is present lagging by 45°, and the second of the two high frequency signals is present leading by 45°. At a fourth port of the hybrid coupler, the first of the two high frequency signals is present leading by 45° and the second lagging by 45°. By the phase-shifted driving of the high frequency sources, the high frequency source signals thereof add up at the third port by constructive superposition, whereas at the fourth port they cancel each other out (destructive superposition). The high frequency sources upstream of the coupler, thus, each require only half the power of the required high frequency output signal. A cascading of such coupler stages is possible to enable the use of high frequency sources with even less source power or to achieve an even higher power of the high frequency output signal.

The fourth port of the hybrid coupler is normally terminated with a terminating resistance of the system impedance (often 50Ω). As described in EP 1 701 376 A1, a high frequency signal is expected at this port only when a high frequency signal reflected by the plasma load is in turn reflected at the high frequency sources.

In the case of mismatching due to different impedances of plasma supply device and plasma load, the power delivered by the plasma supply device is partially or fully reflected. An impedance matching circuit (matchbox) can transform the impedance of the plasma load in certain ranges and match it to the output impedance of the plasma supply device. If the transformation range of the matching circuit is exceeded, or if regulation of the impedance matching circuit cannot follow a rapid impedance change of the plasma, then the total power delivered by the plasma supply device is not absorbed in the plasma, but rather reflection occurs again.

A particular problem in connection with the described unavoidable reflections of the plasma load is the poor absorption in the system as a whole. Since all components of the plasma supply device and the matching circuit are designed for lowest possible loss in the interests of high efficiency, a high frequency signal reflected by the plasma load travels via an optionally present matching circuit back to port 3 of the hybrid coupler, is here split into two parts and returned via ports 1 and 2 towards the high frequency sources of the plasma supply device. The two parts of the reflected high frequency signal, again, experience in the hybrid coupler an identical phase delay by 45° en route from port 3 to port 1 and an identical phase advance by 45° en route from port 3 to port 2, respectively.

The two high frequency sources can be, for example, two self-contained high frequency generators driven by a common control oscillator. This control oscillator can have a phase shift of 90° for the high frequency signals at its two outputs. The two high frequency sources can alternatively be amplifier stages driven by a common high frequency driver transmitter, the output signal of which is split, for example, by way of a second hybrid coupler. Moreover, the two high frequency sources can also be two ports of a second hybrid coupler having a third port connected to a high frequency generator.

To be able to (i) measure accurately and adjust the high frequency power delivered to the plasma load, even during reflection, (ii) have the opportunity to detect incipient arcs and by suitable measures if possible to prevent them from developing fully, and (iii) supply the optionally present matching circuit with the required information about the impedance of the plasma, is it desirable to know all relevant high frequency operating parameters that arise between high frequency generator and plasma load or matching circuit. These include, for example, the power $P_f$ of the high frequency output signal delivered by the plasma supply device, and also the high frequency operating parameters influenced by the complex impedance of the plasma load and optionally the matching circuit, such as power $P_r$ and phase angle $\phi$ of the reflected high frequency signal, and the variables dependent thereon, such as reflection factor, $$|\Gamma| = \sqrt{\frac{P_r}{P_f}},$$

or the total power of the high frequency output signal and reflected high frequency signal, $$P_S = P_f + P_r = P_f(1+|\Gamma|^2),$$

as well as the power of the high frequency signal reflected by the high frequency sources for a second time. In the knowledge of these high frequency operating parameters, the matching circuit can be driven, the power of the high frequency output signals can be adjusted, and the state of the plasma can be reliably determined.

Directional couplers may be used to measure the powers of the high frequency output signal and the returning high frequency signal. A directional coupler necessitates an expensive component, which, even though accuracy should be high in the case of large proportions of reflected high frequency power, requires especially narrow manufacturing tolerances. In addition, to determine the phase, the two measured signals need to be combined before their detection. This can be effected, for example, by vector analysis with or without preceding down-mixing into a different frequency range or into the baseband or by mixing their standardized oscillations. Both methods are quite complex.

U.S. Pat. No. 4,489,271 discloses an arrangement with which the phase angle of the reflected high frequency signal can be also determined. However, this arrangement requires five different couplers.

Another possible method of measuring the output delivered to the load is to measure the current and the voltage. In that case, however, a very good measurement of the voltage and the current sensors must be achieved. Here too, to determine the phase angle $\phi$ and the reflection factor $\Gamma$, a phase comparison of the standardized high frequency measurement signals of current and voltage in a high frequency mixer is required, for example, or a vector analysis of these two measurement signals.

SUMMARY

In one aspect, a simple and reliable circuit is provided that determines the high frequency operating parameters in a plasma supply device containing a hybrid coupler and, in particular, determines the high frequency power delivered to the plasma load, the high frequency power reflected by the plasma load and the phase position thereof, without interrelating the high frequency signals. In this way, the circuit makes available values for the impedance matching circuit and for control and regulation of the plasma supply device, so that an immediate response can be made to changing conditions of the plasma load. relating In a second aspect, high frequency operating parameters that arise during supply of a plasma load by a plasma supply device generating two high frequency source signals of identical frequency phase shifted by 90° with respect to one another and coupled in a hybrid coupler to a high frequency output signal that is transmitted to the plasma load are determined by detecting at least two of the four ports of the hybrid coupler a respective signal that is related to the amplitude of the high frequency signal present at the port, and from that, generating at least one high frequency operating parameter.

In a third aspect, a device is provided for determining high frequency operating parameters which arise between a plasma load and a plasma supply device, wherein the plasma supply device comprises two high frequency sources, the outputs of which are connected to a respective port of a hybrid coupler, and the plasma load is connected to the third port of the hybrid coupler, at which the high frequency source signals are constructively superimposed, wherein measurement circuits are connected to at least two ports of the hybrid coupler, to each measurement circuit there is connected a detector, which generates a measurement signal related to the amplitude of the high frequency signal at the relevant port of the hybrid coupler, and the detectors are connected to an evaluating device, which is designed to determine at least one high frequency operating parameter from the measurement signals.

DESCRIPTION OF DRAWINGS

The same reference numerals have been used in the different Figures for corresponding elements or signals.

DETAILED DESCRIPTION

Figure 1:
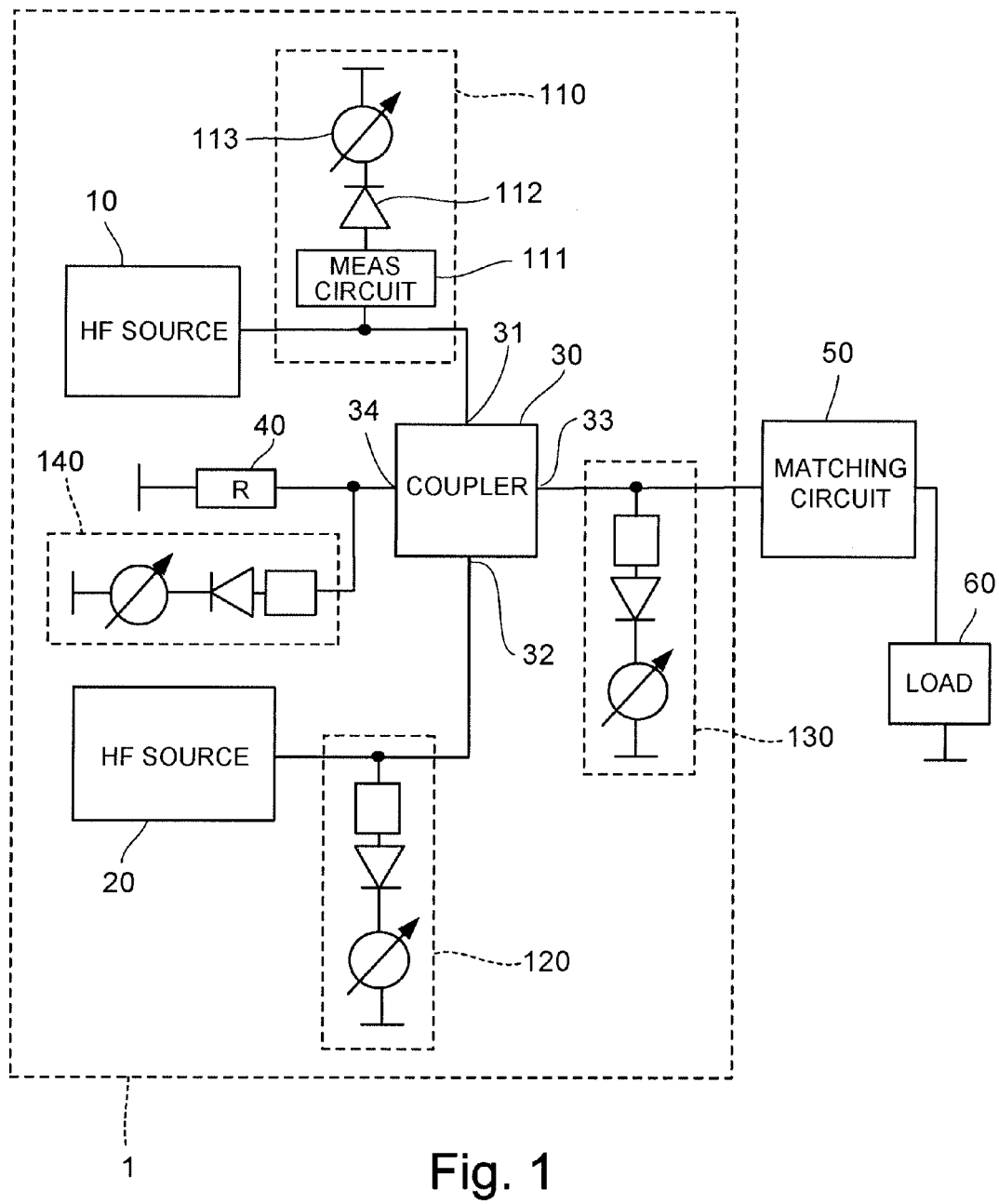
FIG. 1 illustrates a plasma supply device with a schematic illustration of the measurement signal detection.

In a first implementation, high frequency operating parameters that arise during supply of a plasma load by a plasma supply device generating two high frequency source signals of identical frequency phase shifted by 90° with respect to one another and coupled in a hybrid coupler to a high frequency output signal that is transmitted to the plasma load are determined by detecting at least two of the four ports of the hybrid coupler a respective signal that is related to the amplitude of the high frequency signal present at the port, and from that, generating at least one high frequency operating parameter.

For each measurement signal, a portion of the high frequency signal is measured at the respective port. In that case, the portion of the high frequency signal measured for the measurement signal and present at the measurement point can be very small.

After the measurement, a detection can be effected, for example, by a diode or by a different rectifier. Then a low-pass filtering can be carried out, which frees the resulting measurement signal from residual high frequency spectral components. The rate of change of the measurement signals is substantially determined only by the dynamics of the impedance of the plasma load.

For the further processing, it is advantageous if a signal that corresponds to the mean high frequency power at the respective measurement point is generated from the measurement signal by scaling.

The one part of the high frequency signal reflected by the plasma load is also phase-delayed by 45° en route from port 3 to port 1 like the high frequency source signal en route from port 1 to port 3; a superposition of these two high frequency signals is therefore present at port 1, so that for the mean high frequency power at this point the following equation is valid:

$$P_1 = P_q \cdot \left[ \left(1 + |\Gamma| \cdot \cos(\varphi - \frac{\pi}{2})\right)^2 + \left(|\Gamma| \cdot \sin(\varphi - \frac{\pi}{2})\right)^2 \right]$$

Here, $P_q$ is the power of the high frequency source signal, $|\Gamma|$ is the reflection factor, $\varphi$ is the phase angle of the reflected high frequency signal, in which the reflection phase of the plasma load, the line length from the hybrid coupler as far as the plasma load and the phase shifts in an optionally interposed impedance matching circuit are taken into account.

The delay of $\pi/2$ in the superposition of high frequency source signal $U_q$ and the reflected high frequency signal weighted with $|\Gamma|$ derives from the double pass of the distance between port 1 and port 3 of the hybrid coupler, which each time causes a phase shift of $\pi/4 = 45°$.

Like the high frequency source signal en route from port 2 to port 3 previously, the other part of the high frequency signal reflected by the plasma load also experiences a phase advance by 45° en route from port 3 to port 2. Provided that the high frequency power $P_q$ is the same, then at port 2 the following equation is valid:

$$P_2 = P_q \cdot \left[ \left(1 + |\Gamma| \cdot \cos(\varphi + \frac{\pi}{2})\right)^2 + \left(|\Gamma| \cdot \sin(\varphi + \frac{\pi}{2})\right)^2 \right]$$

In this way, the two parts of the reflected high frequency signal are superimposed in phase opposition with the two high frequency source signals on the lines between the high frequency sources and the hybrid coupler. If the high frequency source signal and the relevant part of the reflected high frequency signal have a maximum constructive superposition at the measurement point at port 1, then the superposition at the measurement point at port 2 will have maximum deconstruction and vice versa. The sum of the two high frequency powers $P_1$ and $P_2$ present at the ports 1 and 2 respectively is constant, and represents the sum from the high frequency power $P_f$ running to the plasma load (forward power) and the high frequency power $P_r$ reflected by the load (reverse power).

$$P_S = P_1 + P_2 = P_f + P_r$$

Half the difference between the high frequency power $P_1$ at port 1 and the high frequency power $P_2$ at port 2 is a sine function, the amplitude of which is defined by the reflection factor and the phase of which is defined by the phase angle of the reflected high frequency signal.

$$\frac{P_1 - P_2}{2} = P_f \cdot |\Gamma| \cdot \sin\varphi$$

These variables can be determined if measured values are detected at least at ports 1 and 2 of the hybrid coupler.

A phase shift of the reflected signal cannot be definitely determined by means of the exactly oppositely directed (anti-parallel) superpositions of the forward-running and backward-running high frequency signals at ports 1 and 2, rather, the superpositions are linearly dependent on one another. It is therefore advantageous to obtain a measurement signal also at port 3, as here the superposition of the reflected high frequency signal with the high frequency output signal is effected at an orthogonal angle relative to the superpositions at port 1 and 2. Since both the high frequency output signal and the high frequency signal reflected by the plasma load superimpose at port 3, the difference of the high frequency power at port 3 and the sum of the two high frequency powers present at ports 1 and 2 results in a cosine function, the amplitude of which is defined by the reflection factor and the phase of which is defined by the phase of the reflected high frequency signal.

Half the difference between the measured high frequency power, $P_3$, at port 3 and the sum of the high frequency powers measured at port 1 and port 2, $PS = P_1 + P_2$, is a cosine function, the amplitude of which is likewise defined by the reflection factor and the phase of which is defined by the phase angle of the reflected high frequency signal.

$$\frac{P_3 - (P_1 + P_2)}{2} = P_f \cdot |\Gamma| \cdot \cos\varphi$$

This cosine function is orthogonal to the sine function obtained exclusively at port 1 or port 2.

Because of that, the reflection factor equals $$|\Gamma| = \frac{R}{2 * P_f}$$

with the radius R of the two trigonometric functions $$R = \sqrt{(P_1 - P_2)^2 + (P_3 - (P_1 + P_2))^2}$$

By inserting the auxiliary relation $$P_f = \frac{P_1 + P_2}{1 + |\Gamma|^2}$$

the equations can be solved according to the forward power Pf.

Thus:

$$P_f = \frac{P_1 + P_2}{2} \pm \frac{1}{2}\sqrt{2(P_1 \cdot P_2 + P_1 \cdot P_3 + P_2 \cdot P_3) - P_1^2 - P_2^2 - P_3^2}$$

The reflection factor $|\Gamma|$ can accordingly also be determined.

In addition, the reverse power as well as the standing wave ratio (VSWR, voltage standing wave ratio) can be calculated from the reflection factor and the sum of forward power and reverse power.

The above-described calculations can be replaced by tables, by which high frequency parameters are allocated to the measurement signals.

Detection of a measurement signal at port 4 furthermore permits monitoring of high frequency signals reflected at the high frequency sources, and which have arrived back at the plasma supply device owing to previous reflection at the plasma load. Port 4 carries the sum of the powers reflected by the high frequency sources.

Detection of measurement signals at the ports of the hybrid coupler thus delivers all the desired high frequency operating parameters.

Scaling of the measurement signals into signals that are proportional to the high frequency powers at the measurement points, as well as other calculations, can be carried out especially simply with a digital processor or a digital circuit. For that purpose, the measurement signals must be digitized with an A/D converter.

The high frequency operating parameters obtained in this manner can be used to control or regulate the high frequency output power generated. A constant input of electrical power into the plasma can thus be ensured, as is required in particular for processes with constant deposition or etch rates or for lasers having a constant output power. In particular, error conditions can be deduced from the high frequency operating parameters. From a table of stored states, a control or digital signal processing can select what the response should be in what error states. In this connection, previous states can be considered (taking account of history). An expert system or a neural network can continuously improve the regulation and learn new error situations and respond correspondingly to errors. The regulation of the high frequency source can also be effected by fuzzy logic.

In addition, the high frequency operating parameters can be used to control an impedance transformation between the plasma supply device and the plasma load.

In another implementation, a device is provided for determining high frequency operating parameters which arise between a plasma load and a plasma supply device, wherein the plasma supply device comprises two high frequency sources, the outputs of which are connected to a respective port of a hybrid coupler, and the plasma load is connected to the third port of the hybrid coupler, at which the high frequency source signals are constructively superimposed, wherein measurement circuits are connected to at least two ports of the hybrid coupler, to each measurement circuit there is connected a detector, which generates a measurement signal related to the amplitude of the high frequency signal at the relevant port of the hybrid coupler, and the detectors are connected to an evaluating device, which is designed to determine at least one high frequency operating parameter from the measurement signals.

The high frequency sources can also be represented by correspondingly driven generators or amplifiers or even by two ports of a second hybrid coupler fed by a generator. Each high frequency source can also in turn again comprise an arrangement of further high frequency sources, which are coupled together by further hybrid couplers. The high frequency sources can comprise switching elements. If active drivers are allocated to the switching elements and each drive can be individually driven, and hence duration and point in time of switch-on of the switching element can be individually controlled for each switching element, this can be effected reliably and exactly, taking into consideration the high frequency parameters determined.

The plasma load to be fed is connected to the third port of the hybrid coupler either directly or via the interconnection of further units, such as for example, an impedance matching circuit.

A terminating resistance can be connected to the fourth port of the first hybrid coupler.

The measurement circuit for generating the measurement signals can be, for example, a resistance network or a capacitive or inductive network or a combination thereof. An inductive measurement can also be achieved by an auxiliary winding at the inductances of the hybrid coupler. If the hybrid coupler is constructed using strip line technology, the measurement circuit can be manufactured by means of suitable strip lines.

The measurement point need not be disposed directly at the relevant port of the first hybrid coupler, but in the case of ports 1 and 2 may also be shifted towards the high frequency sources, in the case of port 3 towards the impedance matching circuit or the plasma load and in the case of port 4 towards the terminating resistance.

The detectors for the measurement signals can be, for example, diodes or bridge rectifiers. To smooth each measurement signal, a low-pass filter that blocks the remaining high frequency spectral components can be connected downstream of the particular detector. The measurement signal thus obtained relates to the amplitude of the high frequency signal at the relevant port of the hybrid coupler.

The outputs of the detectors for the measurement signals and of the downstream low-pass filters are connected to an evaluating unit, which is able to determine the high frequency operating parameters from the measurement signals.

Since it is advantageous for the determination of the high frequency operating parameters for the measurement signals to represent the particular high frequency power at the relevant measurement point, the detectors can be correspondingly designed or calibrated. Alternatively, the measurement signals can be converted upstream of or in the evaluating unit into signals that correspond to the particular high frequency power.

To obtain linearly independent superpositions of forward-running and backward-running high frequency signals, it is advantageous for a measurement circuit with downstream detector for generation of a measurement signal to be connected also to port 3 of the hybrid coupler to which the plasma load is connected.

Since the measurement signals follow only changes in the impedance of the plasma load and not the instantaneous value of the high frequency signal, the frequency components to be processed are low enough to allow the measurement signals to be processed and the high frequency operating parameters to be determined by a digital circuit as well. Such a circuit may also be a digital signal processor or a microcontroller or have such a device. For that purpose, the particular measurement signal must previously have been digitized by means of an A/D converter.

If measurement circuits and detectors are connected to the ports 1, 2 and 3 of the hybrid coupler, the evaluating circuit is able, on the basis of the measurement signals, to determine forward power, reverse power and phase angle and all variables derived therefrom. If a detector is connected to port 4, the power of the high frequency signal already reflected by the plasma load and re-reflected by the high frequency sources can additionally be determined.

The evaluating unit can be connected to at least one of the high frequency sources in order to control the latter. In addition, the evaluating unit can be connected to the impedance matching circuit, in order to control the impedance transformation taking place therein.

FIG. 1 is a schematic representation of a plasma supply device 1 comprising two high frequency sources 10, 20, a hybrid coupler 30 with four ports 31, 32, 33, 34, a terminating resistance 40 and measurement devices 110, 120, 130 and 140. An impedance matching circuit 50 is connected to the output of the plasma supply device 1, which is connected to port 33, and the plasma load 60, here represented only as an impedance, is connected to this impedance matching circuit.

The two high frequency sources 10, 20 are connected to the ports 31 and 32 respectively, and each deliver a high frequency source signal to the hybrid coupler 30, the high frequency source 10 being driven in such a way that its signal leads that of the high frequency source 20 phase-shifted by 90°.

The two high frequency sources can be, for example, independent generators driven phased-shifted by 90°, correspondingly driven amplifiers or even simply the outputs of a hybrid coupler or power splitter with a 90° phase shift.

The hybrid coupler 30 delays the high frequency signal of the high frequency source 10 en route from port 31 to port 33 by a phase angle of 45°, whereas it allows the high frequency signal of the high frequency source 20 to lead by 45° en route from port 32 to port 33. Accordingly, both high frequency signals are present constructively superposed at port 33.

En route to port 34, the conditions are reversed. The hybrid coupler 30 lets the high frequency signal of the high frequency source 10 lead en route from port 31 to port 34 by 45°, whilst it delays the high frequency signal of the high frequency source 20 by 45° en route from port 32 to port 34. Accordingly, both high frequency signals are present destructively superposed at port 34 and cancel each other out.

Any high frequency signals reflected by the plasma load 60 and the impedance matching circuit 50 return to port 33 of the directional coupler 30, are split and transmitted via the two ports 31, 32 towards the two high frequency sources 10, 20. If these backward-running high frequency signals are re-reflected at the two high frequency sources 10, 20, these two partial signals have experienced such a delay or acceleration after repeated passage through the hybrid coupler that they cancel out at port 33 and are constructively superposed only at port 34, to which the terminating resistance 40 is connected.

Four measurement devices 110, 120, 130 and 140 are connected to the four ports 31, 32, 33 and 34 respectively of the hybrid coupler 30, the measurement devices in this example being kept especially simple. Each of these measurement devices comprise identical parts, which are explained by means of the measurement device 110. The measurement circuit 111 in the form in this case only of a resistance is followed by a detector 112 for rectification, which in this embodiment is in the form of a diode, and a measurement instrument 113, the second connection of which is connected to earth. By means of the measurement instrument 113 it is possible to observe the voltage obtained with the decoupling circuit 111 and the detector 112, which is related to the amplitude of the high frequency signal at port 31 of the coupler 30. In FIG. 1, such measurement devices are connected to all four ports 31-34 of the coupler 30.

By operating the circuit shown in FIG. 1, by reading off the measurement instruments in the measurement devices 110, 120, 130, 140 and by external calculation, it is therefore also possible to determine high frequency operating parameters.

Figure 2:
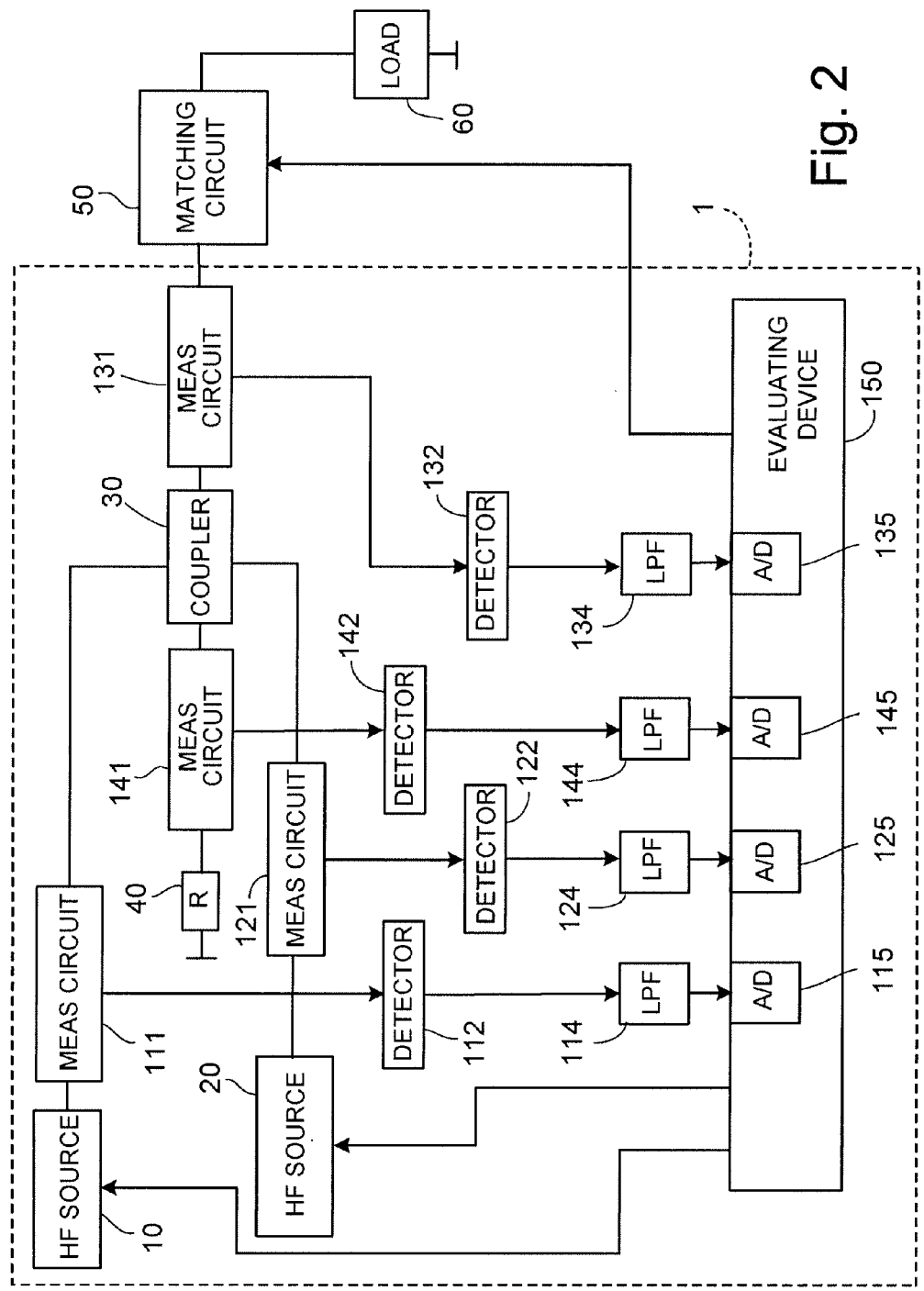
FIG. 2 illustrates a plasma supply device with measurement circuits and evaluating device.

FIG. 2 shows a second exemplary embodiment of a plasma supply device having the main components already known from FIG. 1. The measurement circuits 111, 121, 131 and 141 are again connected to the ports 31, 32, 33, 34 respectively of the hybrid coupler 30. They are followed by the detectors 112, 122, 132 and 142 respectively and low-pass filters 114, 124, 134 and 144 respectively. Instead of the measurement instruments, an evaluating unit 150 is provided, which is equipped at its four inputs with analog-to-digital (A/D) converters 115, 125, 135 and 145 respectively, which digitize the measurement signals. The further processing and evaluation of the measurement signals is effected in the evaluating device 150. The evaluating device 150 can also undertake entirely or partially the control of the high frequency sources 10 and 20 and that of the impedance matching circuit 50, for which purpose it is connected to these by respective control lines. In this way, for example, by controlling the high frequency sources 10, 20, the power of the high frequency output signal at port 33 of the hybrid coupler 30 can be kept constant, or the impedance of the plasma load 60 can be matched by the impedance matching circuit 50 to the output impedance of the plasma supply device 1.

Figure 3A:
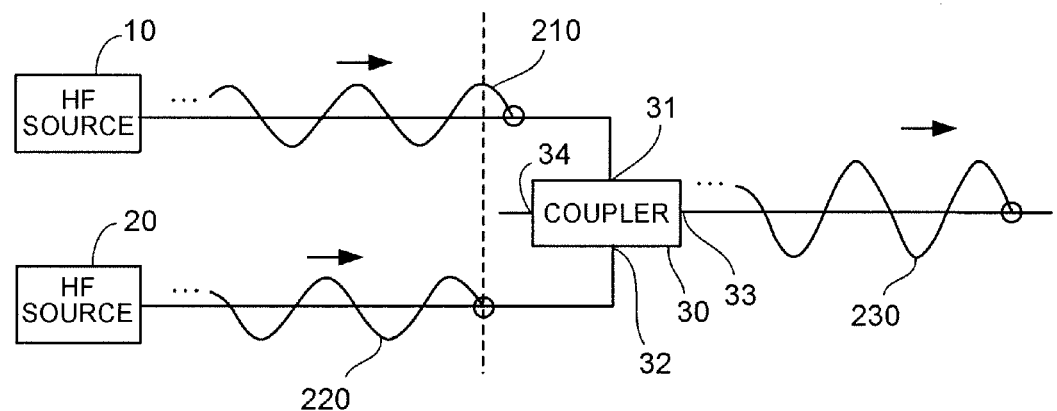
FIGS. 3a and 3b illustrate the local conditions of forward-running and backward-running waves.

In FIG. 3, the spatial phase shift of the high frequency signals on the lines to the ports 31, 32, and 33 of the hybrid coupler can be seen. The illustration of the wave trains 210, 220 is to be understood schematically and does not necessarily reflect the actual wavelength ratios. FIG. 3a shows two instantaneous images after switching on the two high frequency sources 10 and 20. The high frequency source 10 commences with its wave train 210 earlier by a phase angle of 90° than the wave train 220 of the high frequency source 20; both wave trains can be seen in the first instantaneous image to the left of the hybrid coupler 30. The starts of the wave trains are each marked with circles, the broken line indicates the earlier start; the amplitudes of the two wave trains and hence the output powers of the two high frequency sources are identical in this Figure. In the second instantaneous image to the right of the hybrid coupler 30, the wave train 230 coupled in the hybrid coupler 30 leaves the hybrid coupler 30 from port 33 towards the plasma load; by the addition of the powers, the amplitude of the wave train 230 is now as large as the respective amplitudes of the wave trains 210 and 220.

Figure 3B:
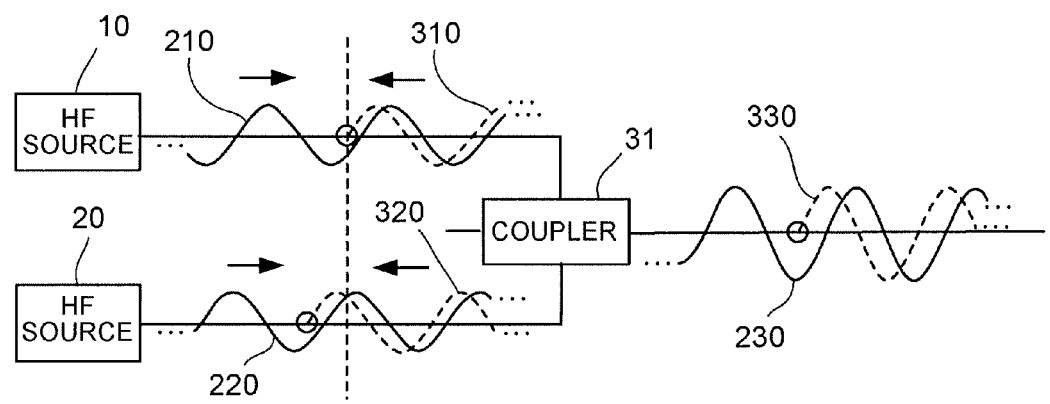

In FIG. 3b, the start of a wave train 330 reflected by the plasma load and likewise indicated by a circle can be seen in the first instantaneous image to the right of the hybrid coupler 30. In this example, a complete reflection is assumed, so that the amplitude thereof is identical to that of the wave train 230. The wave train 330 runs towards the hybrid coupler 30 and is there split into the two wave trains 310 and 320, which can be seen in the second instantaneous image to the left of the hybrid coupler, as they leave the ports 31 and 32 respectively, in order there to be superimposed with the wave trains 210 and 220 respectively continuing to run in the forward direction.

Figure 4A:
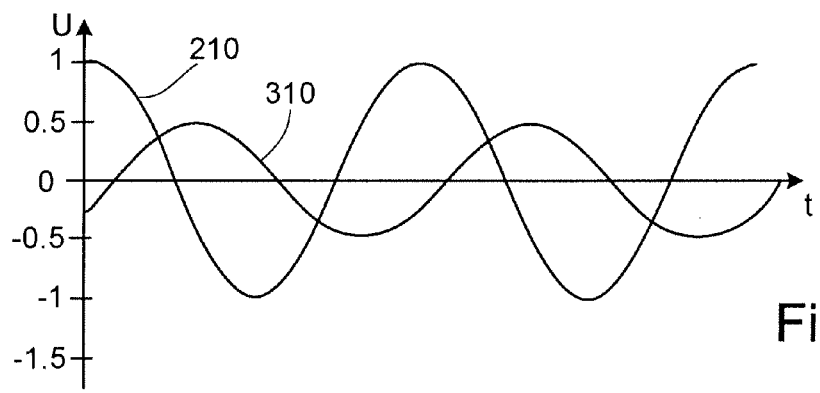
FIGS. 4a, 4b and 4c illustrate the time conditions of forward-running and backward-running waves.
Figure 4B:
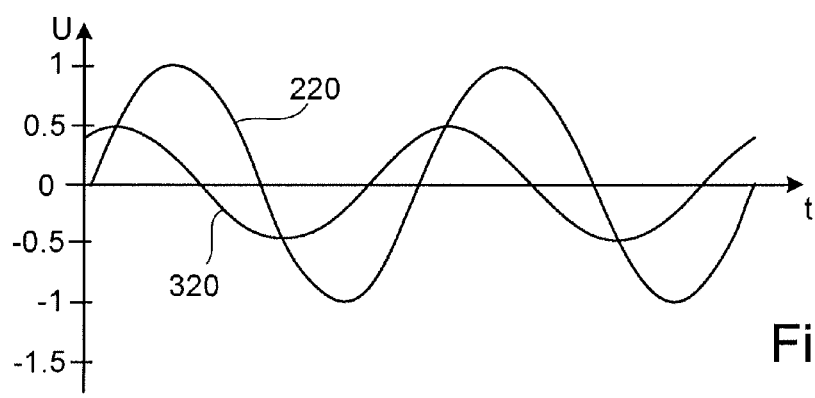
Figure 4C:
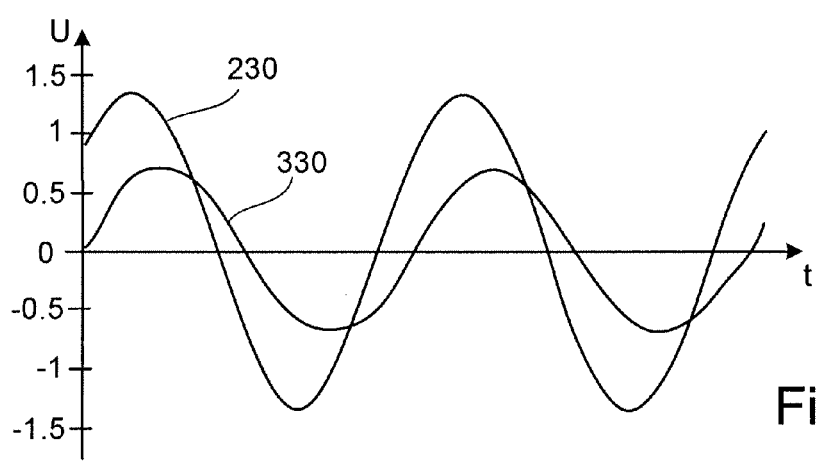

FIGS. 4a-4c show the variation with time of the high frequency signals at the ports 31, 32, and 33 of the hybrid coupler 30. In FIG. 4c, let a high frequency signal 330 reflected by the plasma load have at the port 33 a phase angle φ of 30° with respect to the high frequency output signal 230 running to the plasma load. In addition, in each of FIGS. 4a-4c, for better clarification, let the high frequency signal 330 reflected by the plasma load have just half the amplitude compared with the high frequency signal 230.

The variations in times at the ports 31 and 32 are illustrated in FIGS. 4a and 4b, respectively. The high frequency signal 330 reflected by the plasma load is split by the hybrid coupler into the two high frequency signals 310, which appears at port 31, and 320, which appears at port 32. En route from port 33 to port 31 the signal 310 experiences a delay of 45° compared with the signal 330; in contrast, the signal 320 experiences an acceleration of 45° compared with the signal 330. But since the high frequency source signal 210 leads by 45°, in order to compensate for the phase lag en route from port 32 to port 33, and the high frequency source signal 220 lags by 45°, in order to compensate for the phase lead en route from port 32 to port 33, the high frequency signal 310 now exhibits a delay with respect to the high frequency signal 210 of 30°+90°=120°, whereas the high frequency signal 320 now has a delay with respect to the high frequency signal 220 of 30°−90°=−60°, that is, a lead of 60°.

Figure 5:
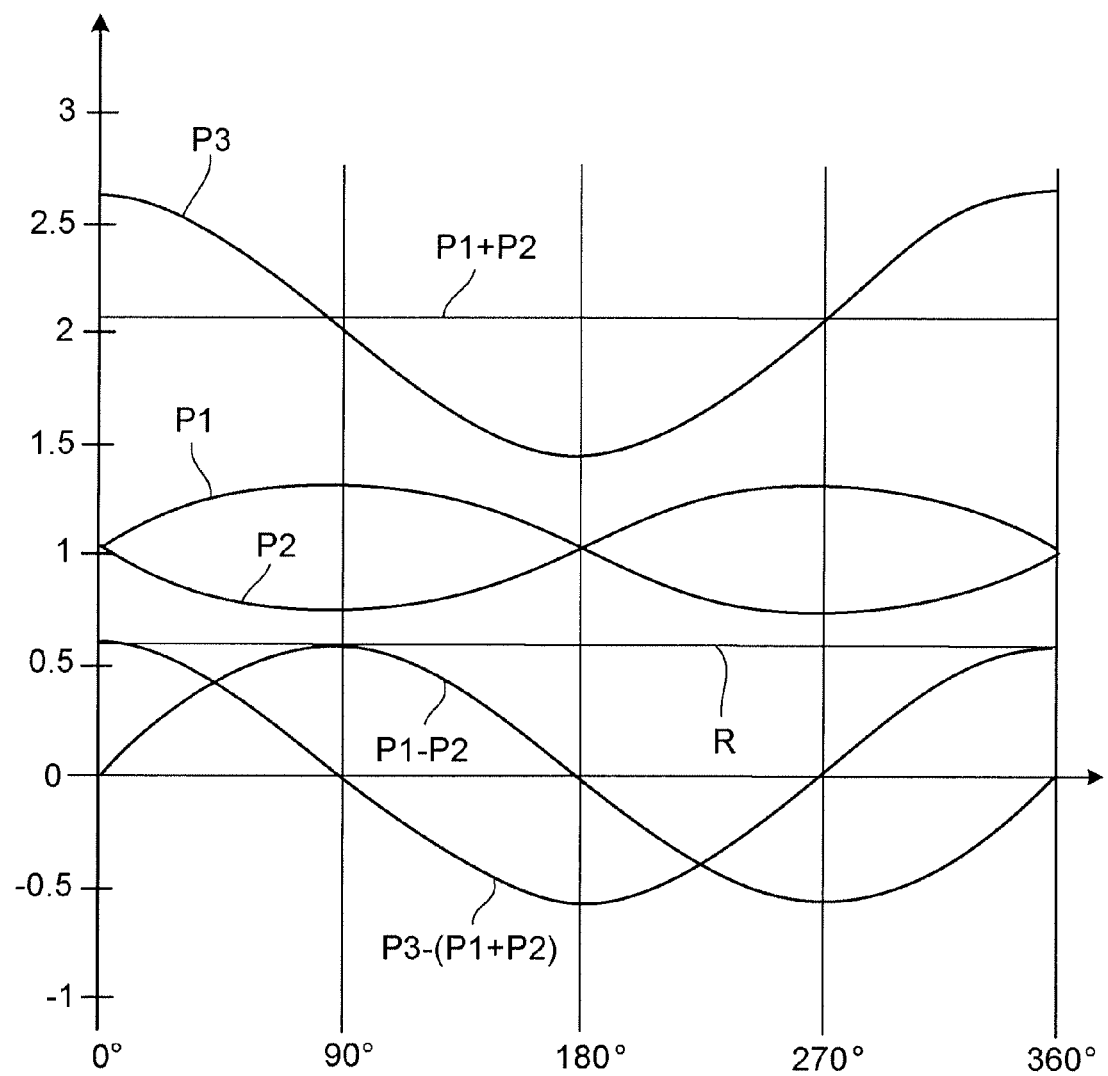
FIG. 5 illustrates different measurement signals and high frequency operating parameters with a constant reflection factor over all phase angles $\phi$ from 0° to 360°.

FIG. 5 shows the mean powers $P_1$, $P_2$, and $P_3$ of the high frequency signals at the ports 31, 32, and 33 that result in each case from the superposition of the outbound and reflected high frequency signals. The values of these mean high frequency powers can be obtained directly from the measurement signals. The curves show these variables as a function of reflection angle φ over a range from 0° to 360° at a constant reflection factor of |Γ|=0.15 and a high frequency output power of PS=2. Furthermore, FIG. 5 illustrates the high frequency operating parameters PS=$P_1+P_2$, $P_1-P_2$, $P_3-(P_1+P_2)$ derived therefrom and the vector length R, from which the reflection coefficient |Γ| and the phase angle φ can be calculated.

What is claimed is:

1. A method of determining high frequency operating parameters in a plasma system including a plasma power supply device coupled to a plasma load using a hybrid coupler having four ports, the method comprising:
    generating two high frequency source signals of identical frequency, the signals phase shifted by 90° with respect to one another;
    generating a high frequency output signal by combining the high frequency source signals in the hybrid coupler;
    transmitting the high frequency output signal to the plasma load;
    detecting two or more signals, each signal corresponding to a respective port of the hybrid coupler and related to an amplitude of a high frequency signal present at the respective port; and based on an evaluation of the two or more signals,
    determining one or more high frequency operating parameters, wherein the high frequency operating parameters are selected from the group consisting of:
        a reflection factor of the plasma load,
        a voltage standing wave ratio,
        a phase angle between a wave running to the plasma load and a wave reflected by the plasma load,
        a power of the high frequency signal reflected by the plasma load,
        a sum of a power of the high frequency output signal and the power of the high frequency signal reflected by the plasma load, and
        a sum of powers reflected by the high frequency signal generators.

2. The method of claim 1, wherein the two or more signals are measured at their respective ports and are detected by subsequent rectification.

3. The method of claim 1, wherein detecting two or more signals comprises detecting a signal at a port through which the high frequency output signal is transmitted to the plasma load.

4. The method of claim 1, wherein detecting the two or more signals comprises digitizing the signals and wherein determining the one or more high frequency operating parameters is effected digitally.

5. The method of claim 1, wherein determining the one or more high frequency operating parameters includes accessing, by a processing device, a table storing values based on the two or more signals.

6. The method of claim 1, wherein detecting the two or more signals includes detecting three signals, each at a respective port of the hybrid coupler.

7. The method of claim 1, further comprising determining the power of the high frequency output signal.

8. The method of claim 1, wherein generating the high frequency output signal comprises controlling or regulating the power of the high frequency output signal as a function of the determined one or more high frequency operating parameters.

9. The method of claim 1, wherein transmitting the high frequency output signal to the plasma load includes controlling an impedance matching of the plasma supply device to the plasma load as a function of the one or more determined high frequency operating parameters.

10. The method of claim 1, wherein determining the one or more high frequency operating parameters comprises determining two or more high frequency operating parameters.

\* \* \* \* \*